(12) United States Patent
Bass et al.

(10) Patent No.: US 7,804,640 B1
(45) Date of Patent: Sep. 28, 2010

(54) COMPOSITE CAVITY FOR ENHANCED EFFICIENCY OF UP-CONVERSION

(75) Inventors: Michael Bass, Indian River Shores, FL (US); Dennis G. Deppe, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 136 days.

(21) Appl. No.: 12/124,620

(22) Filed: May 21, 2008

Related U.S. Application Data

(60) Provisional application No. 61/026,827, filed on Feb. 7, 2008, provisional application No. 60/939,924, filed on May 24, 2007, provisional application No. 60/939,956, filed on May 24, 2007.

(51) Int. Cl.
  *G02B 27/14* (2006.01)
  *H01L 29/06* (2006.01)
  *H01L 21/02* (2006.01)
  *H01L 33/00* (2006.01)

(52) U.S. Cl. ............ 359/328; 359/326; 372/22; 372/50.1; 372/50.121; 257/59; 257/89

(58) Field of Classification Search ......... 359/326–332, 359/630; 372/21, 22, 50.1, 50.121; 257/13, 257/59, 89, E33.002, E33.068, E33.073, 257/E21.002, E29.003
See application file for complete search history.

(56) References Cited

U.S. PATENT DOCUMENTS

| | | | |
|---|---|---|---|
| 4,791,415 A | 12/1988 | Takahashi | |
| 4,871,231 A | 10/1989 | Garcia, Jr. | |
| 5,003,179 A | 3/1991 | Pollack | |
| 5,051,278 A | 9/1991 | Paz-Pujalt | |
| 5,089,860 A | 2/1992 | Deppe et al. | |
| 5,184,114 A | 2/1993 | Brown | |
| 5,192,946 A | 3/1993 | Thompson et al. | |
| 5,245,623 A | 9/1993 | McFarlane | |
| 5,317,348 A | 5/1994 | Knize | |
| 5,359,345 A | 10/1994 | Hunter | |
| 5,583,351 A * | 12/1996 | Brown et al. | ......... 257/89 |
| 5,622,807 A | 4/1997 | Cutler et al. | |
| 5,684,621 A | 11/1997 | Downing | |
| 5,724,064 A | 3/1998 | Stefik et al. | |
| 5,764,403 A | 6/1998 | Downing | |
| 5,846,684 A | 12/1998 | Paz-Pujalt et al. | |

(Continued)

*Primary Examiner*—Daniel Petkovsek
(74) *Attorney, Agent, or Firm*—Brian S. Steinberger; Phyllis K. Wood; Law Offices of Brian S. Steinberger, P.A.

(57) ABSTRACT

Methods, apparatus and systems for an up-converter resonant cavity light emitting diode device includes a semiconductor light source, an up-converter to form the light emitter with up-converting materials and an electrical source coupled with the semiconductor light source for providing electrical energy to the semiconductor light source to provide a desired wavelength emitted light. The semiconductor light source is a resonant cavity light emitting diode or laser that emits an approximately 975 nm wavelength to provide electrical and optical confinement to the semiconductor light source to form a resonant cavity up-converting light emitting diode (UC/RCLED). Rows and columns of electrodes provide active matrix addressing of plural sets of UC/RCLEDs for display devices. The up-converter resonant cavity light emitting diode device has applications in head mounted projection display optical system using spectrally selective beam splitters to eliminate spectral overlap between colors and to combine the red, green and blue beams.

12 Claims, 10 Drawing Sheets

U.S. PATENT DOCUMENTS

| | | |
|---|---|---|
| 5,914,807 A | 6/1999 | Downing |
| 5,943,160 A | 8/1999 | Downing |
| 5,956,172 A | 9/1999 | Downing |
| 6,028,977 A * | 2/2000 | Newsome .................. 385/147 |
| 6,327,074 B1 | 12/2001 | Phillips et al. |
| 6,501,590 B2 | 12/2002 | Bass et al. |
| 6,654,161 B2 | 11/2003 | Bass et al. |
| 6,844,387 B2 | 1/2005 | Bass et al. |
| 6,897,999 B1 | 5/2005 | Bass et al. |
| 7,075,707 B1 | 7/2006 | Rappaport et al. |
| 7,471,706 B2 * | 12/2008 | Bass et al. .................... 372/21 |
| 7,560,707 B2 * | 7/2009 | Bratkovski ............... 250/458.1 |

* cited by examiner

COMPOSITE CAVITY FOR ENHANCED EFFICIENCY OF UP-CONVERSION

This application claims the benefit of priority to U.S. Provisional Patent Application Nos. 61/026,827 filed on Feb. 7, 2008, U.S. Provisional Patent Application No. 60/939,924 filed on May 24, 2007 and U.S. Provisional Application No. 60/939,956 filed on May 24, 2007.

FIELD OF THE INVENTION

This invention relates to up-conversion efficiency and, in particular, to methods, systems, apparatus and devices for up-conversion materials that absorbs infrared light and emits visible light, with the materials placed within a composite cavity for improved up-conversion efficiency and for enabling greatly improved up-conversion based displays including headset displays for virtual reality and three-dimensional imaging.

BACKGROUND AND PRIOR ART

Liquid crystal displays LCDs have been popular for many applications, primarily in low power areas such as battery-powered systems or small size applications. However, LCDs have suffered from several problems over the years. For example, LCDs are difficult to view in low ambient light environments and have a limited viewing angle and poor contrast.

Various examples of prior art color liquid crystal displays include U.S. Pat. Nos. 5,359,345 and 5,724,062 both issued to Hunter. The Hunter patents describe liquid crystal displays that require arranging individual pixels in rows and corresponding columns which can be expensive, complicated to manufacture, and have narrow angular view ranges with low brightness. U.S. Pat. No. 4,791,415 to Takahashi; U.S. Pat. No. 4,871,231 to Garcia, Jr.; U.S. Pat. No. 5,184,114 to Brown; U.S. Pat. No. 5,192,946 to Thompson et al.; and U.S. Pat. No. 5,317,348 to Knize also describe display systems that have similar problems.

U.S. Patents that describe panel displays using two-frequency up-conversion fluorescence include U.S. Pat. Nos. 5,684,621; 5,764,403; 5,914,807; 5,943,160; and 5,956,172 all issued to Downing. The Downing '403 patent appears to have some relevance to the subject invention because it is primarily concerned with embodiments where the use of different layers for red, green and blue emitters and briefly describes some mixing of crystal type materials in a single display media. However, for the single display media, Downing '403 uses nanometer sized particles which would inherently be difficult to form, handle and disperse in a display medium.

Other known patents in these fields include U.S. Pat. No. 5,003,179 to Pollack; U.S. Pat. No. 5,051,278 to Paz-Pujalt; U.S. Pat. No. 5,245,623 to McFarlane; U.S. Pat. No. 5,622,807 to Cutler; and U.S. Pat. No. 5,846,684 to Paz-Pujalt et al. However, these patents also fail to overcome the problems with the other patents described above.

Another known up-conversion prior art reference includes U.S. Pat. No. 5,089,860 issued to Deppe et al. on Feb. 18, 1992. This patent describes a quantum well device with control of spontaneous photon emission and method of manufacturing, wherein spontaneous photon emission intensity in a semiconductor quantum well is strongly influenced by a highly reflecting interface with the quantum well interface spacing being less than the optical emission wavelength of the quantum well.

Other know prior art up-conversion includes U.S. Pat. Nos. 6,327,074 and 6,501,590 issued to Bass et al. respectively on Dec. 4, 2001 and Dec. 31, 2002, which are assigned to the same assignee as the subject invention. The Bass patents describe display mediums using emitting particles that are dispersed in a transparent host. The two and three dimensional color image displays include a display medium having a substantially uniform dispersion of red, green and blue visible light emitting particles sized between approximately 0.5 to approximately 50 microns therethrough. The particles can be dye doped polymethylmethacrylate (pmma) plastic, and the display medium can be pmma, acrylic plastic or glass. Other particles can be used such as rare earth doped crystals. The two dimensional display uses three laser sources each having different wavelengths that direct light beams to each of three different types of particle in the display medium. Light is absorbed by the particles which then become excited and emit visible fluorescence. Modulators, scanners and lens can be used to move and focus the laser beams to different pixels in order to form the two dimensional images having different visible colors.

U.S. Pat. No. 6,654,161 issued to Bass et al. on Nov. 25, 2003, which is also assigned to the same assignee as the subject invention describes dispersed crystallite up-conversion displays based on up conversion of near infrared light to visible light. The display medium is a transparent polymer containing particles of crystals doped with $Yb^{3+}$ and other rare earth ions. The $Yb^{3+}$ ions absorb light from a commercially available diode laser emitting near 975 nm and transfers that energy to the other dopant ions. Using a fluoride crystal host, $NaYF_4$, co-doped with $Tm^{3+}$ ions blue light at about 480 nm was obtained, with $Ho^{3+}$ or $Er^{3+}$ ions green light at about 550 nm is obtained and with $Er^{3+}$ red light at about 660 nm is obtained. The display medium can be used with applications for full color, high brightness, high resolution, displays.

U.S. Pat. No. 6,844,387 issued to Bass et al. on Jan. 18, 2005, which is also assigned to the same assignee as the subject invention describes composites of inorganic luminophores stabilized in polymer hosts. The two and three dimensional display medium can have a novel transparent polymer composite containing particles of crystals doped with $Yb^{3+}$ and other rare earth ions. The polymer composite creates homogeneously dispersed compositions without cracking or delamination of the film and can be used for various optical applications.

U.S. Pat. No. 6,844,387 issued to Bass et al. on Jan. 18, 2005, another patent having the same assignee as that of the subject invention discloses an optically written display. The two, three dimensional color displays can include uniform dispersion of red, green and blue visible light emitting micron particles. Pumping at approximately 976 nm can generate green and red colors having an approximately 4% limit efficiency. One light source can generate three colors with a low limit efficiency. Modulators, scanners and lens can move and focus laser beams to different pixels forming two dimensional color images. Displays can be formed from near infrared source beams that are simultaneously split and modulated with micro electro mechanical systems, spatial light modulators, liquid crystal displays, digital micro minors, digital light projectors, grating light valves, liquid crystal silicon devices, polysilicon LCDs, electron beam written SLMs, and electrically switchable Bragg gratings. Pixels containing Yb,Tm:YLF can emit blue light. Pixels containing Yb,Er(NYF) can emit green light, and pixels containing Yb,Er:KYF and Yb,Ef:$YF_3$ can emit red light.

The concept of frequency up-conversion (UC) of infrared-to-visible light in rare-earth (RE) doped materials was reported more than forty years ago for the first time. The efficiency that was observed or expected for this process was low in singly doped media. It was quickly noticed that up-conversion could be made one or two orders of magnitude more efficient by using ytterbium (Yb) as a sensitizer ion in addition to the active ion: erbium (Er), holmium (Ho), or thulium (Tm).

In years past, efficient up-conversion (UC) materials were investigated, for photonic applications, such as in UC lasers (visible lasers that are pumped by infrared diode lasers), or in display applications. However, because no powerful source existed in the 980-nm region in order to excite those up-converters, no practical product came out of the research. With the development of powerful 980-nm diode lasers lead by the telecommunication industry, there can now be legitimate practical applications.

It has been noticed in the prior art that pumping conditions caused heating of the material and that higher efficiencies were obtained with low duty cycle excitation. It was also reported that for a same average input power, higher efficiencies were expected in pulsed excitation mode than in continuous wave excitation due to the quadratic nature of the process.

The effect of the pumping conditions for display applications of UC materials needs to be understood, as several technologies might be used to form the image. The infrared source can either be scanned (vector-addressed or raster-scan), or the image can be directly projected using Digital Micromirror Devices (MEMS) such as in the Texas Instrument Digital Light Processing (DLP.TM.) technology. In the latter case the materials would be undergoing pulse-excitation, whereas they would be quasi-continuously excited in the second case.

U.S. Pat. No. 7,075,707 issued to Rapaport et al. on Jul. 11, 2006, and to the same assignee as that of the subject invention, describes a substrate design for optimized performance of up-conversion phosphors utilizing proper thermal management. The patent describes methods and compositions for using an up-conversion phosphor as an emitting material in a reflective display and Polymer compositions for display mediums, and red, green, blue (RGB) display mediums. Roles of the pumping duration and character on the temperature and the efficiency of the up-conversion process in (Ytterbium, Erbium or Thulium) co-doped fluoride crystals are also described. A problem with prior art up-conversion devices is limited efficiency since much of the incident pump light is back scattered by the up-converting particles and does not get used to generate visible light.

SUMMARY OF THE INVENTION

A primary objective of the invention is to provide methods, apparatus and systems for up-converting materials that absorb infrared light and emit visible light placed within a composite cavity for improved up-conversion efficiency and enabling greatly improved up-conversion based displays.

A second objective of the invention is to provide methods, apparatus and systems to prepare a composite cavity for up-converting materials, in order to both enhance the absorption of pump light and to improve the emission of the visible light for improved up-conversion efficiency.

A third objective of the invention is to provide methods, apparatus and systems for composite cavities that increase the efficiency of visible light emission from up-converters by placing them in the composite cavities which can enhance the absorption of incident pump light, or the emission of the desired visible light or both.

A fourth objective of the invention is to provide methods, apparatus and systems for up-converting materials that absorb infrared light and emit visible light for high-resolution displays based on the dense semiconductor integration similar to that used in computer chips. Because of its high speed, the new technology can take advantage of high-speed active matrix addressing with a large pixel count to also deliver high brightness.

A fifth objective of the invention is to provide methods, apparatus and systems for composite cavities used in conjunction with up-converting materials that absorb infrared light and emit visible light for high-resolution display for virtual reality technology hardware by providing very high-resolution, compact, and high brightness emissive display chips for head mounted displays that also incorporate stereoscopic 3-D imaging.

A sixth objective of the invention is to provide methods, apparatus and systems for a new chip technology in head set displays for virtual reality and 3-D imaging. Emissive displays simplify headset design and can reduce the overall size to be widely adopted in the near term consumer markets priced in the $500 to $2000 range to compete with other computer-interfaced technologies such as laptop displays, while producing comparable or better image quality.

A seventh objective of the invention is to provide methods, apparatus and systems for a virtual/augmented reality headset design for applications in virtual and augmented reality and the market entry of this technology for augmented reality use especially by first responders.

An eighth objective of the invention is to provide methods, apparatus and systems for new chip technology in head set displays for virtual reality and three-dimensional imaging with low drive voltage and high efficiency compatibility with a high image quality and robust head mounted display (HMD) that can be battery operated with a long battery lifetime. The low voltage operation, which can be less than approximately 1.5 volts independent of emission color, makes this new display technology compatible with lithium ion, nickel cadmium, or other battery sources without the use of added electronics.

A ninth objective of the invention is to provide methods, apparatus and systems for new chip technology in head set displays for virtual reality and three-dimensional imaging with the ability to directly modulate the emissive display also makes it capable of extremely high efficiency and results in long battery lifetime. Because the low voltage drive is due to up-conversion of GaAs resonant cavity light emitting diodes.

A tenth objective of the invention is to provide methods, apparatus and systems for new chip technology in head set displays for virtual reality and three-dimensional imaging for use in augmented reality by first responders, law enforcement, homeland security, manufacturing and inventory and other applications where user requirements include high brightness, high efficiency and compatibility with battery operation, robust operation in extreme environments, and low cost.

An eleventh objective of the invention is to provide methods, apparatus and systems for using an up-converter/RCLED as a low voltage, wide color gamut backlight source for battery operated electronics that can use solid-state backlighting in spatial light modulator displays, especially LCDs and LCoS displays and light indicators are used in cell-phones, handheld computers (e.g., PDAs, iPhones), laptop computers, personal entertainment devices (e.g., IPODS and MP3 players) cameras, and most other portable electronics; devices that generally operate with a nominal 3 V lithium battery supplied bias level.

A first preferred embodiment of the invention provides a monolithic up-converting resonant cavity light emitting diode RGB pixel comprising an array of resonant cavity light emitting diodes producing an output light and an array of up-converters coupled with the array of resonant cavity light emitting diodes.

The output light from the array of resonant cavity light emitting diodes induces optical excitation in the array of up-converters. A power source applies an electrical energy to the array of resonant cavity light emitting diodes which generates an output to excite the up-converters to convert near-infrared light to generate a light in the visible range. Each up-converter includes an optical cavity coupled with one of the array of resonant cavity light emitting diodes and a film containing an up-converting material deposited on the optical cavity, wherein cavity tuning is accomplished by a thickness of the up-converting material containing film.

The optical cavity has a low cavity quality factor for efficient excitation by the resonant cavity light emitting diodes. In a preferred embodiment, the resonant cavity light emitting diode is a 975 nm resonant cavity light emitting diode based on an InGaAs quantum well. In another embodiment, the device includes an AlAs/GaAs back mirror to provide the necessary wavelength selectivity and bandwidth.

The monolithic up-converting resonant cavity light emitting diode RGB pixel may also include an optical system coupled with the monolithic up-converting resonant cavity light emitting diode RGB pixel for use as a color multiplexed projection system. The optical system includes a wavelength selective beam splitter to eliminate a spectral overlap between produced red, green and blue light beams in a color multiplexed projection system. Alternatively, the monolithic up-converting resonant cavity light emitting diode RGB pixels are used in a micro display device having plural sets of the monolithic up-converting resonant cavity light emitting diode RGB pixels for displaying an image to a user. In yet another embodiment, the monolithic up-converting resonant cavity light emitting diode RGB pixels include a red display device, a green display device and a blue display device for producing a red image, and green image and a blue image, respectively, a wavelength selective beam splitter for filtering the red, green and blue images to eliminate spectral overlap between the produced red, green and blue images and to combine the reflected red, green and blue images in a color multiplexed projection system and an absorber for absorbing the eliminated spectral overlap beams transmitted through the wavelength selective beam splitter to the absorber.

A second embodiment describes another novel an up-converter resonant cavity light emitting diode emissive display array. The display array includes an array of resonant cavity light emitting diode up-converter pixels, a series of isolation trenches for electrically isolating each one of the resonant cavity light emitting diodes in the array, an array of electrodes for providing electrical energy to the array of resonant cavity light emitting diode up-converters, an array of signal electrodes for selectively enabling each one of the pixels in the resonant cavity light emitting diode up-conversion array and an insulator for separating the an array of signal electrodes from the an array of electrical contacts.

A third embodiment provides a method for fabricating an up-converter resonant cavity light emitting diode integrated circuit comprising the steps of fabricating an array of resonant cavity light emitting diodes on a substrate, etching horizontal and vertical trenches for isolating each of the resonant cavity light emitting diodes in the array, fabricating transparent electrical contacts on a p-side of each of the resonant cavity light emitting diodes in the array, applying a thin film insulator over the electrical contacts, fabricating column n-side electrodes connecting an n-side of each of the resonant cavity light emitting diodes in the array, depositing a visible light mirror and applying a film up-converter on a surface of each of the resonant cavity light emitting diodes in the array.

A fourth embodiment provides an up-conversion display system including an up-conversion display device for producing an image. The up-conversion display includes plural sets of up-conversion resonant cavity light emitting diodes for converting infrared light into a visible light, plural sets of rows and columns of electrodes, each set of rows and columns coupled with one of the plural sets of up-converter resonant cavity light emitting diodes for active matrix addressing and a processing device connected with the plural sets of rows and columns of electrodes for generating the active matrix addressing signals to control the operation of each of the plural sets of up-converter resonant cavity light emitting diodes. The up-conversion display system also includes an optical system for projecting an image from the up-conversion display device to a user. In an embodiment, the up-conversion display system is used in a head mounted display for displaying an image to the wearer of the head mounted display.

Further objects and advantages of this invention will be apparent from the following detailed description of preferred embodiments which are illustrated schematically in the accompanying drawings.

DESCRIPTION OF THE PREFERRED EMBODIMENTS

Figure 1:
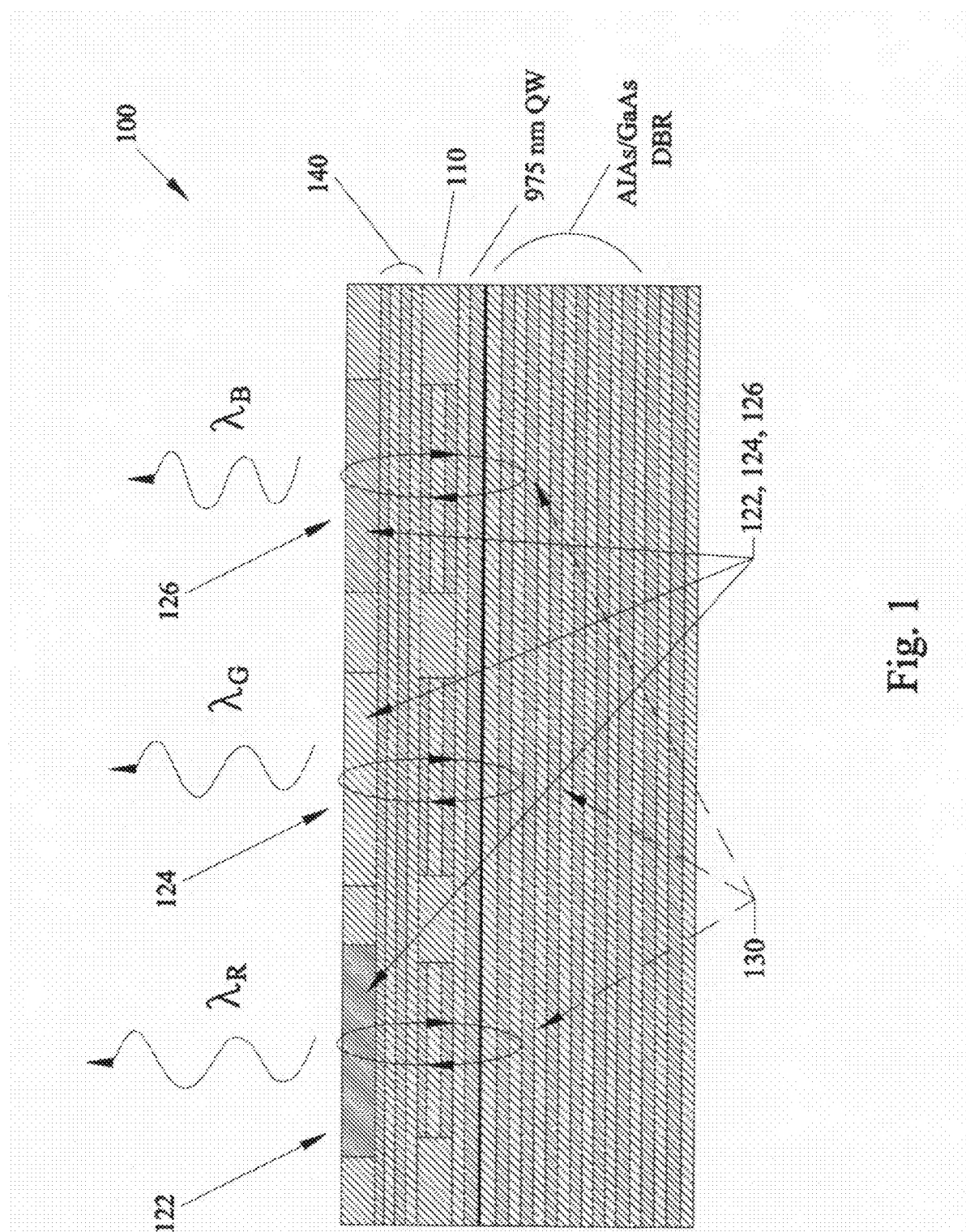
FIG. 1 is a schematic showing the excitation scheme of the up-converter resonant cavity light emitting diode red, green and blue pixel.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

| | |
|---|---|
| 100 | RGB pixel |
| 110 | RCLED |
| 122 | red up-converter |
| 124 | green up-converter |
| 126 | blue up-converter |
| 130 | surface emitter |
| 140 | RGB mirror |
| 200 | UC/RCLED pixel array |
| 220 | RCLED |
| 300 | pixel |
| 322 | red up-converter |
| 324 | green up-converter |
| 326 | blue up-converter |
| 400 | pixel |
| 410 | column electrodes |
| 415 | row electrodes |
| 430 | column isolations |
| 435 | row isolations |
| 500 | optical system |
| 510 | beam splitter |
| 512 | green beam |
| 514 | red beam |
| 520 | absorber |
| 530 | beam splitter |
| 534 | blue beam |

Prior art up-conversion patents include U.S. Pat. No. 5,089,860 issued to Deppe et al. on Feb. 18, 1992, U.S. Pat. Nos. 6,327,074 and 6,501,590 issued to Bass et al. respectively on Dec. 4, 2001 and Dec. 31, 2002, U.S. Pat. No. 6,654,161 issued to Bass et al. on Nov. 25, 2003, U.S. Pat. No. 6,844,387 issued to Bass et al. on Jan. 18, 2005 and U.S. Pat. No. 7,075,707 issued to Rapaport et al. on Jul. 11, 2006 which are assigned to the same assignee as the subject invention and which are incorporated herein by reference hereto.

The apparatus, methods, system and devices of the present invention relate to up-converting materials that absorb infrared light and emit visible light placed within specially designed optical resonators. This combination of up-converting material with a resonant cavity is hereinafter referred to as a composite cavity.

In the composite cavity it is required that the up-converting material to be as scatter free as possible for placement within the cavity through decomposition techniques, such as e-beam deposition, within a binder that is compatible with the composite cavity. In many embodiments it is also necessary that the particle binder combination be scatter free.

The configuration of the resonant composite cavity is such that the absorption of the incident pump light can be greatly enhanced through multiple passes and field interference. Under ideal conditions, the cavity can lead up to 100% absorption of the incident pump light since the absorption can be made much higher than possible with a single mirror. By enhancing the absorption of pump light, the efficiency of visible light is greatly improved leading to significantly improve up conversion based display screens.

In an embodiment, the composite cavity is designed to enhance the emission of the visible light by setting preferred directions in which the light emitted within the cavity can exit. As a result the angular spread of the visible light is reduced and the screen brightness is improved.

In yet another embodiment the composite cavity is configured to enhance the emission of visible light to limit which wavelength of visible light exits the cavity to enhance the purity of the color of the light emitted and to expand the color gamut of a display using the composite cavity.

In a preferred embodiment, the cavity is also configured to prepare the composite cavity so that it both enhances the absorption of pump light and improves the emission of the visible light.

In another embodiment, the apparatus, methods, systems and devices of the present invention includes application for a new type of head set display for advanced applications in immersive virtual reality and 3-D imaging. Virtual reality in immersive environments is an emerging field in research and technology with important applications in education, training, and medicine, as well as entertainment. The requirements for high-resolution imaging and brightness have now pushed the limits of today's available display chips.

In the preferred embodiment of the present invention, a unique combination of up-conversion materials with semiconductor light emitting devices are used for a new high-resolution display based on the dense semiconductor integration similar to that used in computer chips. Because of its high speed, the new technology can take advantage of high-speed active matrix addressing with a large pixel count to also deliver high brightness.

The display technology of the present invention solves the most important problems for virtual reality technology hardware by providing very high-resolution, compact, and high brightness emissive display chips for head mounted displays that also incorporate stereoscopic 3-D imaging.

FIG. 1 is a schematic showing the excitation scheme of the up-converter/resonant cavity light emitting diodes (UC/RCLED) red, green and blue (RGB) pixel 100. The up-converters 122, 124 and 126 are excited by light emitted from the approximately 975 nm resonant cavity light emitting diodes (RCLED) array 110. A broadband RGB mirror 140 is used to increase the emission efficiency of the surface emitters 130. A second mirror (not shown) could also be placed above the up-converters 122, 124 and 126 and separately tuned to the red, green, and blue emission peaks to further increase the efficiency and spectral purity, where cavity tuning is accomplished by the up-converter containing film thicknesses.

Semiconductor chip technology can provide an important cost advantage by reducing the chip size since chip cost becomes strongly dependent on the number of chips a wafer can produce. Here the 975 nm GaAs-based RCLED plays a pivotal role. To be low cost the display chip must have high yield, requiring both high uniformity and high reliability.

Figure 2:
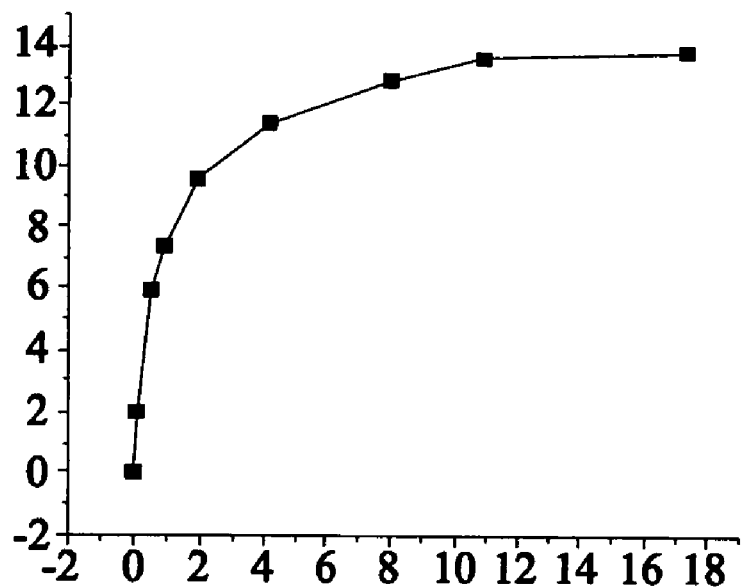
FIG. 2 is a graph showing the measured raw efficiency of a white light emitting combination of up-converting particles in an index matching oil as a binder plotted versus the 975 nm irradiance used as the pump.

While providing separate red, green, and blue emitters, the up-converters can also be combined to produce white light. In particular, the blue and red emitters are complementary colors since the red emitter also emits a small amount of green light. When these two are combined, a white light source is produced. FIG. 2 is a graph showing the measured raw efficiency of a white light emitting combination of up-converting particles in an index matching oil as a binder plotted versus the 975 nm irradiance used as the pump.

In FIG. 2 the raw photometric efficiency is shown as the ratio of emitted light corrected for the eye's sensitivity to the incident pump light. The dependence on pump irradiance is to be expected since up-conversion is a non-linear optical process. At low irradiance, the efficiency depends linearly on irradiance and at higher powers, this dependence shows signs of saturation. This is due to the saturation of the energy level populations involved in the up-conversion process. The important feature to note is that around a few $W/cm^2$ the efficiency is near its maximum. The saturation at the low incident power density of 17.5 $W/cm^2$ is an ideal match to 975 nm RCLEDs.

Figure 3:
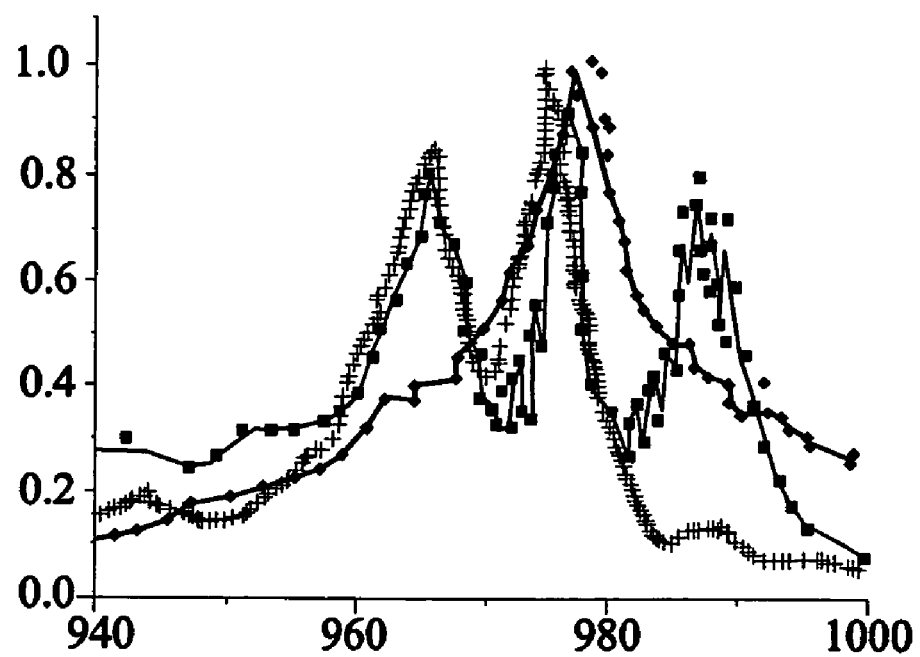
FIG. 3 is a graph showing the normalized excitation (fluorescence) with respect to pump wavelength of up-converter emitters for each of red, green and blue.
Figure 4:
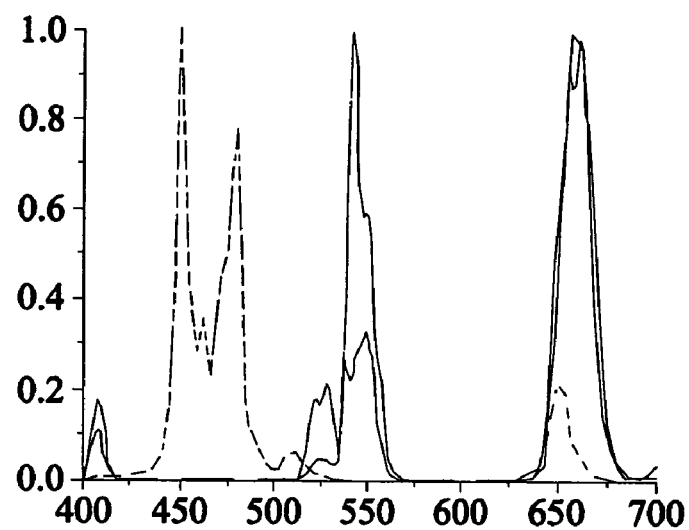
FIG. 4 is a graph showing the normalized fluorescence intensity with respect to wavelength for green, red and blue emitters operating at maximum efficiency and each has been normalized to its highest peak.

The spectral responses for excitation and emission of the up-converters are shown in FIGS. 3 and 4. Up-conversion efficiency is sensitive to the pump wavelength and is most efficient within a few nanometers near approximately 975 nm. A unique feature of the up-converters is the common absorption band for each of the red, green, and blue emitters that peaks around approximately 975 nm as shown in FIG. 3.

The necessary wavelength selectivity and bandwidth are readily provided by the approximately 975 nm RCLED based on an InGaAs quantum wells (QW) and AlAs/GaAs mirrors, with the absorption bandwidths of the approximately 975 nm light easily matched by an RCLED Q (quality factor) of approximately 100 to approximately 200.

The RGB up-converter absorption characteristics enable exciting each of the three up-converters with a RCLED array. As shown in FIG. 1, the low cavity Q makes possible the most efficient excitation by the RCLED that can use a highly reflecting back mirror and only a moderate reflectivity for the front mirror. The low Q enables heavy doping of the semiconductor layers to obtain low electrical resistance into the microdisplay chip to increase the electrical efficiency and provide high speed switching of the pixels.

FIG. 4 shows the spectral emission of the red, green, and blue up-converters excited with an approximately 975 nm light. Spectrally sharp emission peaks are obtained in the different color bands. Another important feature of these up-converters is that these color bands are more widely separated in spectral emission than that achieved in most prior art displays. This wider spectral emission translates into a greater range of colors that can be achieved, so that the color richness of the image can be higher than in prior art displays. The individual red, green, and blue up-converters include some color emission in the other color bands.

Addressable 20×20 μm RGB pixels using the UC/RCLED emitters are used for the active matrix addressing. In this example, the individual color elements of the pixel are approximately 3×15 μm, with metallization traces of approximately 1.5 μm. The direct current measurements include spectral purity, overall brightness, efficiency, and crosstalk. The RGB pixels are fabricated into sparse arrays for ease of individual probing and microlens arrays are used for projection imaging and the necessary CMOS control chips for active matrix addressing is designed for insertion of the microdisplay chip into an existing headset.

An important advantage of the UC/RCLED emissive display array is its potential for very high speed active matrix addressing. Active matrix addressing has become an essential requirement of high performance display technologies and provides significantly improved brightness, grey scale, and color richness over passive matrix addressing. Active matrix addressing allows each pixel to remain with its color and brightness set while all other pixels of the display are addressed. This is generally achieved by applying a gate voltage to switch on a row of pixels (and their separate color elements) so that display data can be fed separately in parallel to the activated row of each of the pixels RGB separate elements.

Figures 5A, 5B:
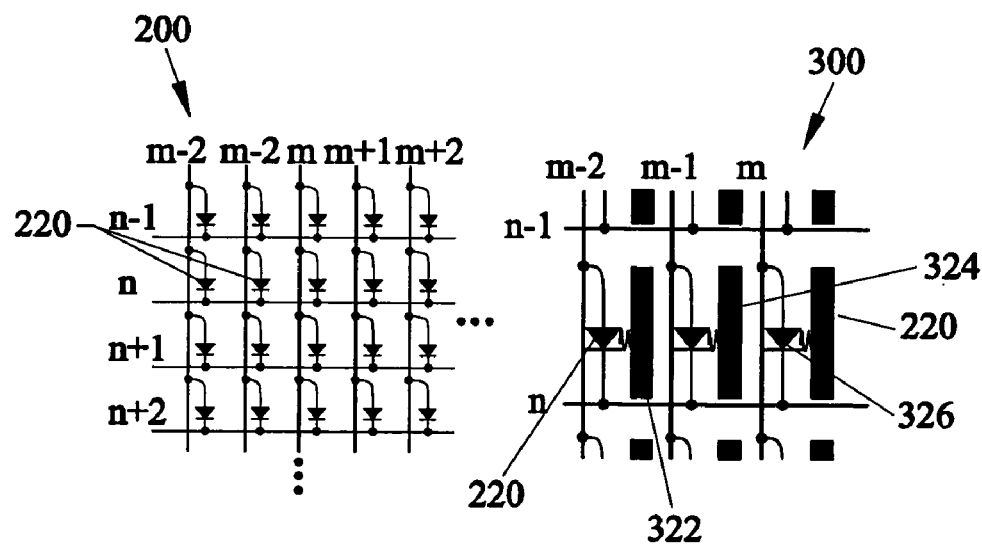
FIG. 5*a* is a schematic of a diode array used in active matrix addressing according to the present invention.
FIG. 5*b* is an exploded view of one pixel of the diode array shown in FIG. 6*a*.

FIG. 5a shows a schematic example for active matrix addressing for the UC/RCLED display given a 2-D array of N×M pixels 200. FIG. 5b is an exploded view of one pixel 300 showing the red, green and blue up-converters 322, 324 and 326, respectively. Energy storage of each pixel color is carried out by up-converters 222, 224 and 226, while the nearly ideal nonlinear voltage-optical response of the RCLED 220 provides for gate switching and data storage in the form of optical excitation in the up-converter.

Since each pixel 300 has separate red 322, green 324, and blue 326 color elements, the array 200 actually has N rows and 3M columns of electrodes. Referring to the schematic diagram shown in FIG. 6, the active matrix addressing is accomplished by applying an appropriate gate voltage to row n while all other rows are maintained off. Because the approximately 975 nm RCLEDs have abrupt turn-on voltages of approximately 1.2 V, they are switched using a gate voltage of approximately −0.8 V applied to the row electrode 415 contacting the n-side of the RCLEDs, while the data voltage applied to each column electrode 410 contacting the p-side RCLEDs that sets the intensity to that pixel color may range from approximately 0 to approximately 1 V. The specific data voltage applied to a column electrode 410 along with the electrical resistance of the RCLED then establishes that pixel element's intensity.

The approximately 1 ms fluorescence lifetime of the up-converters establishes that the refresh rate is as high as approximately 1 kHz. Because the RCLED modulation bandwidth can exceed approximately 100 MHz, the semiconductor microdisplay chip uses very high speed active matrix addressing. The large RCLED bandwidth allows for active matrix addressing of a microdisplay chip with greater than 105 rows of pixels, with a display refresh rate of approximately 100 Hz. The parallel addressing of the data voltages eliminates the limit on the number of columns of pixels in the microdisplay chip for the same matrixing speed. Because of the RCLED's high speed, active matrix addressing becomes feasible even for total pixel counts that could exceed 1010.

Figure 6:
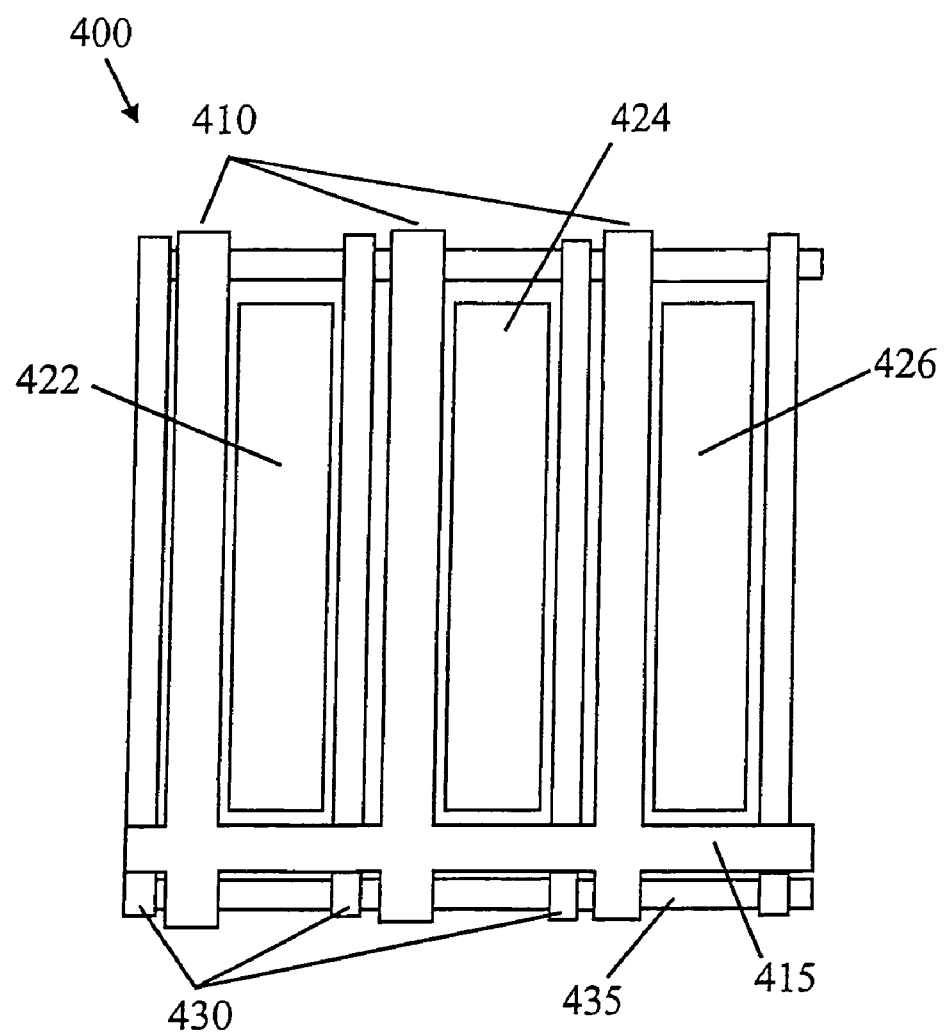
FIG. 6 is a schematic block diagram of an up-converter resonant cavity light emitting diode pixel showing the configuration of the electrodes, isolation columns and resonant cavity light emitting diodes for red, green and blue.

FIG. 6 is a schematic illustration of a top-down view of the layout of the 20×20 μm RGB pixel 400 showing the row 415 and column 410 electrodes, row 435 and column 430 isolations, and RCLED up-converters 422, 424 and 426. FIG. 6 can be compared with the pixel cross-section shown in FIG. 1, with some details not shown. Emitter dimensions are set by the active area of the RCLED to approximately 3×15 µm and are selected for standard semiconductor etching, well-established lift-off techniques, and thin film processing. The thin film up-converters 422, 424 and 426 cover an area slightly greater than the RCLED emission region. Transparent electrical contacts are used on the p-side of the RCLEDs, while the rows of RCLEDs have a common n-side connection to be electrically contacted by horizontal gold (Au) electrodes.

The RCLED fabrication can be based on thin film processing that includes low aspect selective etching, so that the row and column isolation trenches 435 and 430 are in fact quite shallow and can be micron or even sub-micron wide. The approximately 20×20 µm pixel design shown in FIG. 6 can be based on Au metallization of 1.5 µm widths.

Electrical isolation of the individual RCLEDs can be achieved both by the horizontal (row) trenches 435 that separate the rows of pixels on the n-side of the RCLED and vertical (column) trenches 430 that finalize the isolation on the p-side. A thin film insulator separates the n-side and p-side electrodes. Because the RCLED is configured as a thin film device, in a preferred embodiment the semiconductor surface prior to deposition of the visible light mirror and up-converting materials is planar to within approximately 0.3 µm. This nearly planar surface is important in achieving small pixel sizes. When reduced to an approximately 5×5 µm pixel, the lithography can be maintained at ≧approximately 0.5 µm to achieve high yield based on standard III-V fabrication techniques. For an approximate 1000 row display and approximately 100 Hz refresh rate, the pixel modulation speed only reaches approximately 100 kHz.

The pixel and emitter dimensions allow a relatively straightforward implementation into the 2-D electrically addressable array shown in FIG. 5$a$. An RGB pixel size of approximately 20×20 µm produces an approximately 1 M pixel display chip of approximately 3 cm per side, including allowance for electrical contacts to the array. Electrical contacting to the array for active matrix addressing only slightly increases the relative size of the display chip for moderate contact pads of approximately 20 µm square. In fact, flip-chip mounting has been demonstrated to approximately 5 µm size contacts. The more revolutionary pixel size of approximately 5 µm on a side also would only slightly increase the overall size of the microdisplay chip.

The additional important characteristics of the RCLED design for the microdisplay chip are crosstalk, speed, and efficiency, with a design appropriate for dense integration. The saturated power level of the RCLED depends mainly on its radiation pattern and solid collection angle into the vertical mode. For the RCLEDs of the present invention, the optical collection is generally approximately 20% of the radiated emission from the RCLED's active region, and depends more on the optical cavity design as opposed to material quality since the emission power saturates at a given carrier density in the QW, as opposed to the injected current density. The lack of dependence on material quality is also caused by the relatively low Q values making optical scattering and absorption effects rather insignificant even for relatively poor epitaxial quality.

The RCLED's saturated power level then depends mainly on the number of quantum wells used in the active region and its cavity design. A single InGaAs QW is desirable for achieving good electrical isolation and therefore low electrical cross talk, and provides a saturated optical power density at approximately 975 nm of approximately 125 W/cm$^2$. This power density is more than sufficient to obtain high efficiency in the up-converters.

On the other hand, the actual electrical-to-optical efficiency of the RCLED is sensitive to material quality and quantum well design, as is the electrical crosstalk. Because of the close RCLED spacing, the dominant source of electrical crosstalk is the carrier diffusion in the quantum wells active material. Without careful design, the electron-hole charge injected into the quantum well can diffuse several microns outside the region receiving direct electrical injection.

Precise modulation doping is used to limit this diffusion to approximately 0.5 µm. For the approximately 20×20 µm pixel that uses approximately 4 µm of separation between RCLEDs, the short diffusion length results in adequate electrical isolation. For the smaller pixel target of approximately 5×5 µm, the RCLEDs can be reduced to approximately 1×3 µm sizes and electrical cross talk may become problematic. For these smaller sizes InGaAs quantum dot active material provides a direct replacement of the InGaAs QW, and can eliminate electrical cross talk even at the smallest dimensions through its lateral electronic confinement. The use of the quantum dot RCLED represents an important future avenue in this technology both to reduce pixel size and take advantage of even stronger cavity effects using a Purcell enhancement. Purcell enhancement, the shortening of the RCLED's radiative lifetime by an ultra small cavity, has the necessary physics both to increase the RCLED modulation speed and increase its overall efficiency to near unity.

Along with active matrix addressing and electrical crosstalk, optical crosstalk in the RGB pixel needs to be characterized. The optical cross talk occurs due to scattering of the approximately 975 nm or visible light emissions. A layer design reduces the degree to which optical scattering affects pixel performance. Therefore, optical cross talk is a larger concern in the thin-film up-converters as opposed to the RCLEDs, since the approximately 975 nm emission from the RCLEDs is predominantly vertical and inter-element optical coupling of the RCLEDs can be controlled through modulation doping. However, the up-converters will be placed in very close proximity so some optical scattering may result.

Figure 7:
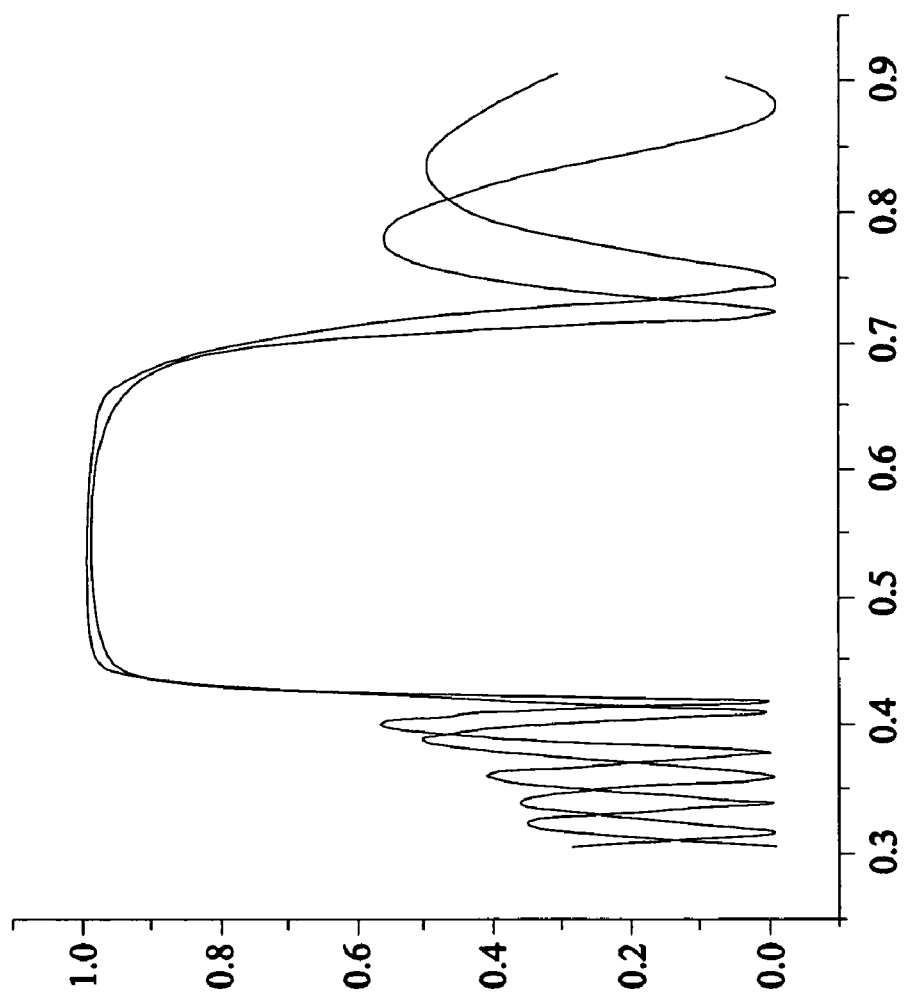
FIG. 7 is a graph showing reflectivity of multilayer high contrast mirrors compatible with resonant cavity light emitting diode fabrication.
Figure 8C:
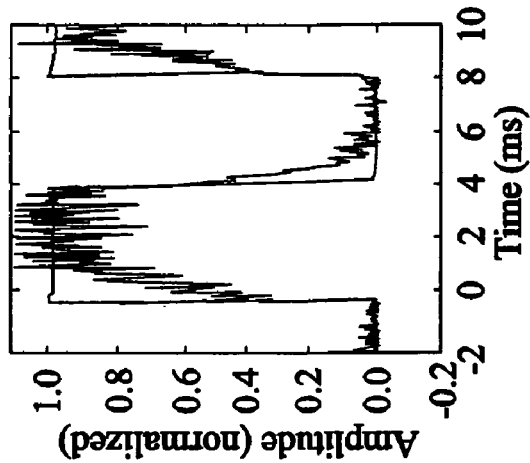
FIG. 8c shows the measured time response of the up converted emitted visible light for blue when excited by a resonant cavity light emitted diode operating at approximately 975 nm.
Figure 8B:
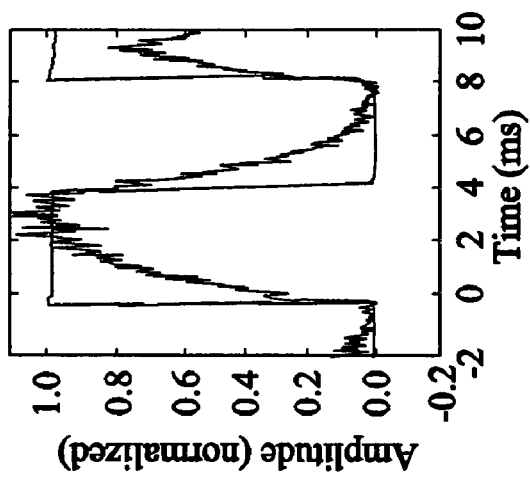
FIG. 8*b* shows the measured time response of the up converted emitted visible light for green when excited by a resonant cavity light emitted diode operating at approximately 975 nm.
Figure 8A:
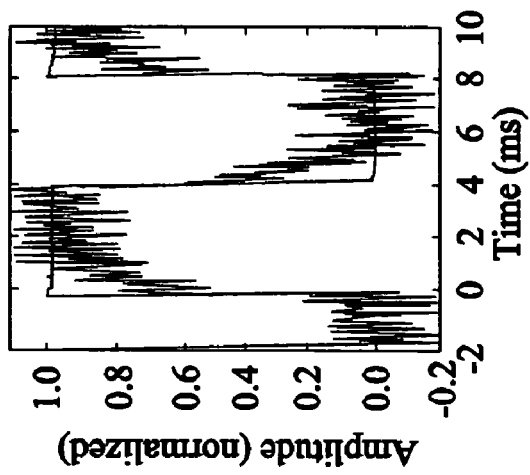
FIG. 8*a* shows the measured time response of the up converted emitted visible light for red when excited by a resonant cavity light emitted diode operating at approximately 975 nm.

The visible light reflector design for the up-converters shown in FIG. 1 is based on high contrast films that easily transmit approximately 975 nm and have a total thickness of less than approximately 0.5 µm. The visible mirror's reflection bandwidth is shown in FIG. 7 and covers the wavelength range from approximately 0.42 to approximately 0.70 µm with a transmission minimum at 750 nm. Referring back to FIG. 1, by varying the film thicknesses of the different color up-converters, resonant optical cavities for the red, green, and blue cavities are spectrally engineered with a final single mirror pair deposition following formation of the up-converters. Such passive resonant cavities each spectrally tuned for either the red, green, or blue up-converter enhances the color purity, improve brightness, and eliminates or reduces optical cross-talk between the up-converters.

The brightness advantages of the UC/RCLED micro displays result from their high efficiency up-conversion combined with the high speed matrix addressing. As previously described, the up-converter efficiencies depend on the irradiance of the pump light with the up-converter in close contact with the RCLED in the array, and the irradiance determines the brightness of the display when producing white light. An adequate approximation of the spectral characterization is determined by considering that equal amounts of each color are required to produce white light. As previously indicated, the approximately 3×15 µm RCLED produces a saturated output intensity at approximately 975 nm of 125 W/cm$^2$. Since this is above the level at which the output of the up-converters saturate (see FIG. 2), relatively low bias levels can be used to produce an RCLED output power of approximately 17.5 W/cm$^2$. At this irradiance, the up-conversion efficiency is approximately 14 lumens/W.

Because of the active matrix addressing, each RCLEDs is only powered on for approximately 10$^{-3}$ of the time so that its average power density while producing white light is only approximately 1.75×10$^{-2}$ W/cm$^2$. Since the RCLED area is approximately 45×10$^{-8}$ cm$^2$ the average 975 nm power delivered per RCLED is approximately 79×10$^{-10}$ W. Thus, each group of 3 RCLEDs produce approximately 3.3×10$^{-7}$ lumens. Since there are 106 groups of 3, the total, number of lumens L is approximately 0.33 when the display is producing white light. In an embodiment, the display is approximately 20×20 mm in area or approximately 4×10$^{-4}$ m$^2$. The brightness, B, is then B=L/A$_d$ where d is the sr appropriate to a real emitter so that B=262 cd/m$^2$ or nits.

This represents a very bright, high-resolution (million pixel) micro display with significantly better performance than any typical head mounted micro display currently in use. For comparison, current headset micro displays produce only 30 to 100 nits and contain fewer than 100,000 pixels. Therefore, the dense integration combined with large pixel count and active matrix addressing enable high resolution and high brightness. This brightness can also be achieved with an estimated total electrical power of only approximately 0.24 W delivered to the chip.

The high resolution UC/RCLED micro display that uses approximately 1,000,000 approximately 20×20 µm pixels is approximately 2 cm per side. However, while the estimated brightness is a significant improvement over existing head mounted displays, it is not bright enough for use in high ambient lighting environments such as in daylight or for medical surgeries where bright ambient lighting is essential. The brightness of the micro displays can be achieved by increasing the electrical input power to each pixel since the total number of lumens continues to increase beyond the irradiance that saturates the up-converters. Thus, there is a trade-off between operation at maximum efficiency, estimated above, and operation at maximum brightness.

Increasing the irradiance by a factor of 10 above the value giving maximum efficiency may reduce the efficiency by a factor of 2, but at the same time the total output of lumens from the green source can be increased by more than a factor of 10. Similar results have been obtained for both the red and blue emitters. Operating the display chip at the RCLED saturation output of approximately 125 W/cm$^2$ increases the brightness to approximately 1080 cd/m$^2$ or nits for an electrical input of approximately 1.7 W.

Another technique to increase the brightness is to increase the fill factor of each pixel by minimizing the size of the conductors and isolations. In the display considered, the fill factor is approximately 135/400 or approximately 0.34. By fitting the three emitters into a pixel that is smaller, say approximately 15×18 cm$^2$, the fill factor increases to approximately 0.5 and the area of the display decreases from approximately 4×10$^{-4}$ cm$^2$ to approximately 2.7×10$^{-4}$ cm$^2$. The brightness of this display first considered would be approximately 388 nits while the approximately 1080 nits microdisplay would go to approximately 1600 nits. This scalability allows us to consider embodiment of the UC/RCLED microdisplay chips for use in high ambient lighting environments.

Since the UC/RCLEDs of the present invention are produced by techniques already well developed in the electronics industry for semiconductor device manufacturing, the potential for much smaller microdisplays is possible. For example, UC/RCLEDs as small as approximately 1×3 µm allow space for interconnects and other necessary electronic components enable pixels of the order of approximately 5×5 µm. The smaller micro display chips offer significantly reduced cost, power requirement, weight, and overall headset size, and can be enabling for eyeglass displays.

The robust operation of the GaAs-based RCLEDs combined with solid-state up-converters, high brightness possible with the directly modulated emissive microdisplay, and low cost of the GaAs approach make this display technology potentially important for rugged, low resolution HMDs for augmented reality. The potential for high modulation speed in the RCLEDs combined with high current density capability offers the possibility of small sized microdisplay chips with a much higher pixel count than competing technologies. The small microdisplay chip size can be used to realize compact HMDs as well as high image quality in a high definition HMD for virtual reality.

The present invention also provides a novel form of matrix addressing combined up-converter/RCLED pixels based on energy storage within the up-converters that comes from their millisecond time constants for radiative decay. The robust operation of the GaAs-based RCLEDs combined with solid-state up-converters, high brightness with the directly modulated emissive microdisplay, and low cost of the GaAs approach for rugged, low resolution HMDs for augmented reality. The potential for high modulation speed in the RCLEDs combined with high current density capability offers the possibility of small sized microdisplay chips with a much higher pixel count than competing technologies. The small microdisplay chip size can be used to realize compact HMDs as well as high image quality in a high definition HMD for virtual reality.

Figure 9:
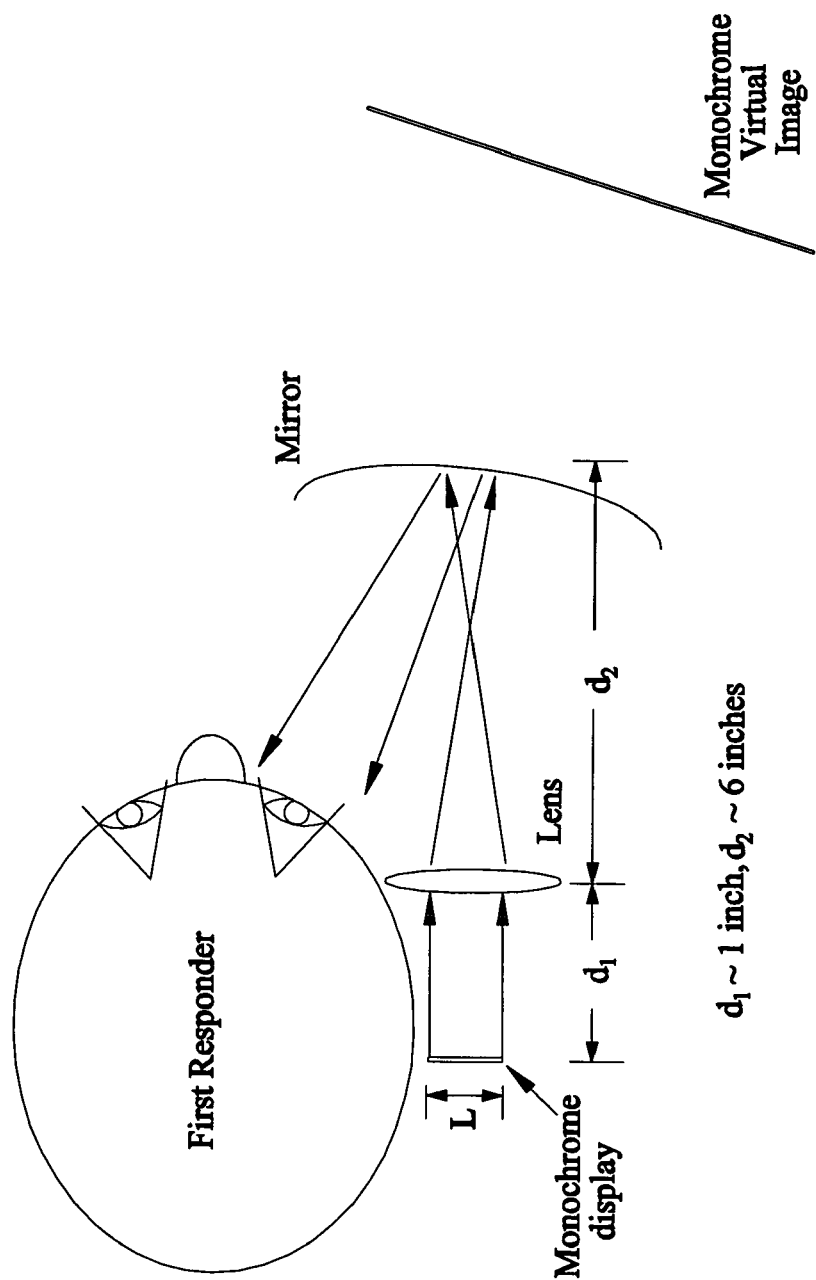
FIG. 9 is a top view showing a user head mounted display optical system according to an embodiment of the present invention.

FIG. 9 shows a top schematic illustration of a head mounted display optical system for projecting a virtual image to the eye of a wearer according to the present invention. As shown, the virtual image is approximately 30 cm behind the curved mirror. The system incorporates the features of the up converter resonant cavity light emitting diode microdisplay for a low resolution and low cost monochrome headset display for use in a range of service and augmented reality applications, and an advanced three color virtual reality headset display that uses the small pixel size and full color gamut of microdisplay chip technology. FIG. 9 shows a schematic of the monochrome prototype headset design according to the present invention. The monochrome design for augmented reality uses only three optical components, a focusing or relay lens, an imaging mirror that generates the virtual image display, and the GaAs-based microdisplay chip. As shown, the virtual image is approximately 30 cm behind the curved mirror. Different pixel counts were studied along with pixel size and pitch, focusing lens, imaging minor curvature, lens to display chip distance, and lens to imaging mirror distance.

Figure 10A:
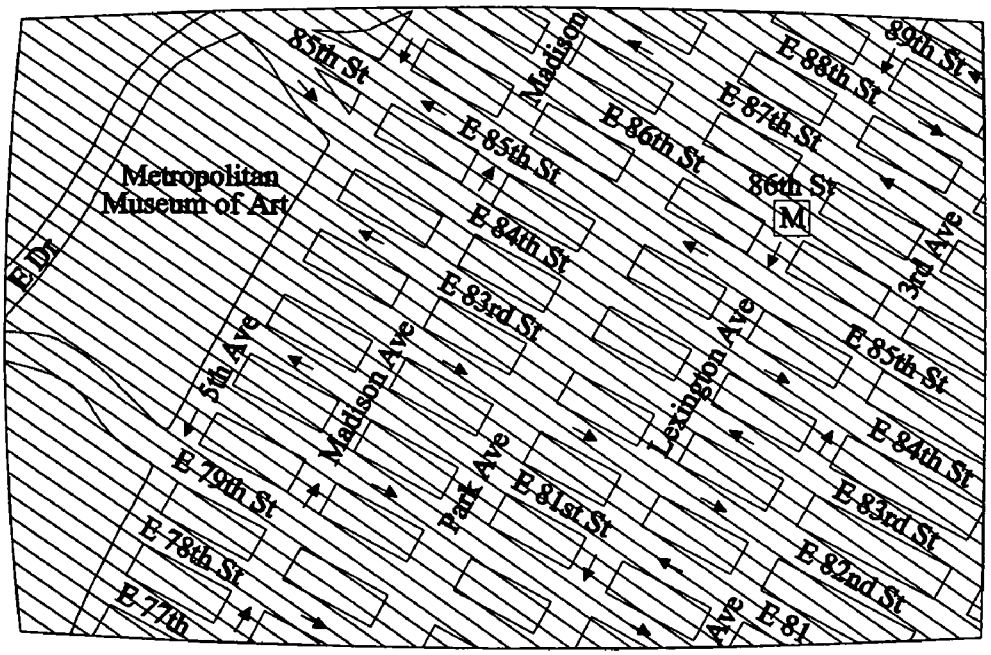
FIG. 10a shows a black and white example of a green and black projected map image for the head mounted display optical system shown in FIG. 9.
Figure 10B:
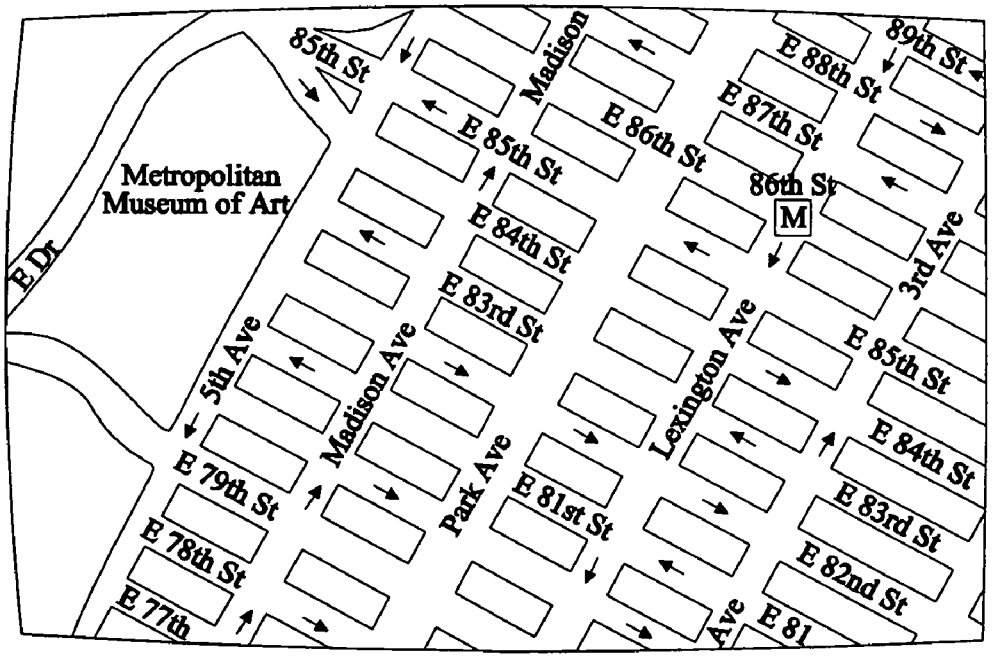
FIG. 10b shows a black and white example of a color projected map image for the head mounted display optical system shown in FIG. 9.

FIGS. 10a and 10b show projected map images based on the optical system shown in FIG. 9 for a green and black image in FIG. 9a and a color image shown in black and white in FIG. 9b. As shown, only a slight barrel distortion of the image along the left vertical image borders, showing that the present invention produces high quality augmented reality. FIGS. 10a and 10b show two examples of possible projected images based on 300×200 pixel count display chips and optical designs for the lens and minor optimized for the working distances shown in FIG. 9. The example with 300×200 pixels was conducted for simplicity and because it is a good approximation to a one quarter SVGA microdisplay having 320×240 pixels. Both lens and minor aberrations were included so that image distortion could be verified, and a slight barrel distortion of the projected image can be seen on the left side of both images, but the image quality is surprisingly detailed despite the low pixel count. This experiment verified that high quality images could be obtain with standard optical designs and working distances suitable for a robust, low cost head mounted display.

The types of images shown in FIG. 10 could prove invaluable to first responders, and can be produced by a robust, high efficiency, high brightness head mounted display technology of the present invention. An example of interest is the situation in California and Florida where firefighters fight a large number of wildfires. In such a situation the men and women engaged in firefighting need critical information that includes spatial imaging of the countryside, the immediate fire locations, wind conditions, and positions of fellow firefighters. Because of the danger involved in some situations this information could prove lifesaving. Lightweight, high brightness battery operated HMDs that are readily attached to firefighting helmets and that can reliably operate in these extreme conditions could provide this information in video format rapidly and accurately, and in operating conditions where communication by walkie-talkies is difficult or impossible.

The use of a head mounted display, with for example a single flip-down imaging mirror, could augment or replace much of the use of the walkie-talkies while leaving the firefighters hands free if necessary and provide greater and more detailed information than voice communication. A similar situation also occurs for firefighters that enter burning buildings, where infrared sensors and handheld displays are currently used to locate occupants that may be trapped in the burning structure. Helmet-fitted infrared cameras using the same helmet as the flip down head mounted display could be used to generate the display. This type of imaging also has commercial applications, and similar need exists for homeland security in border control. The present invention has applications in a variety of markets that would be able to utilize this type of HMD, with critical features being low cost, lightweight, robust operation, high efficiency and battery compatibility with long battery lifetime, and high image quality at limited resolution.

Figure 11A:
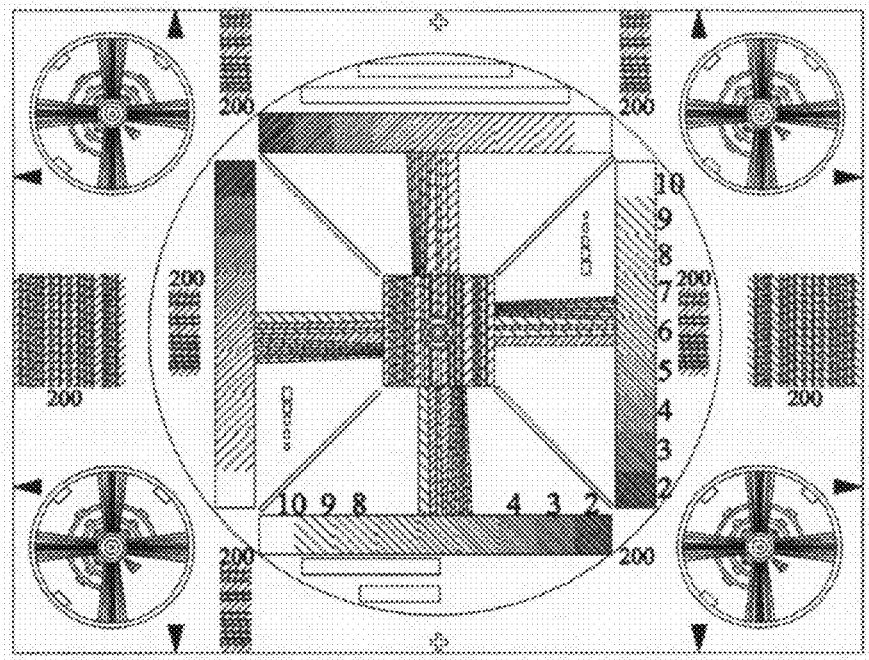
FIG. 11a shows an optical simulation of an original grid pattern.
Figure 11B:
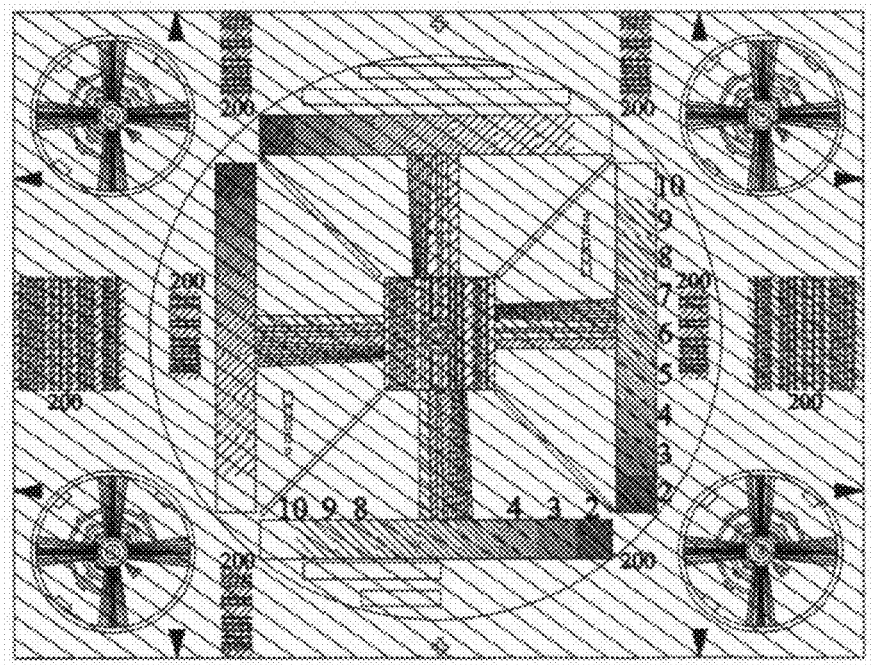
FIG. 11b shows an optical simulation of grid pattern based on 300-by-200 pixels using the optical system shown in FIG. 9.

Along with the map images, grid patterns have also been studied and an example is shown in FIGS. 11a and 11b. FIG. 11a shows the original image that is then imaged as shown in FIG. 11b assuming a 300×200 pixel green monochrome display using the optics of FIG. 9. Again a slight distortion occurs in the corners of the image. However the information content is more than adequate for first responders and to provide schematic information of parts or mapping of a factory warehouse and inventory.

U.S. Provisional Patent Application No. 61/026,827 filed on Feb. 7, 2008 assigned to the same assignee as the present application incorporated herein by reference hereto, discloses high definition resolution in a multiplexed RGB display system. The high-resolution RGB design includes considerably more complex optics that can be incorporated for applications that include medical surgery, gaming and entertainment, training, and education. An important advantage of the up-converter microdisplay approach is its potential to reach an extremely large color gamut of greater than approximately 125% of that established by the National Television Standards Committee (NTSC). This color gamut exceeds all existing display technologies, including nitride LEDs and OLEDs. For example, nitride LED backlights are currently being developed that reach approximately 90% of the NTSC color gamut. However, specific to the up-converter approach of the present invention are the small spectral overlaps that occur between the red, green, and blue up-converters due to the common rare earth ion transitions available to the dopants in the different fluoride hosts.

Figure 12:
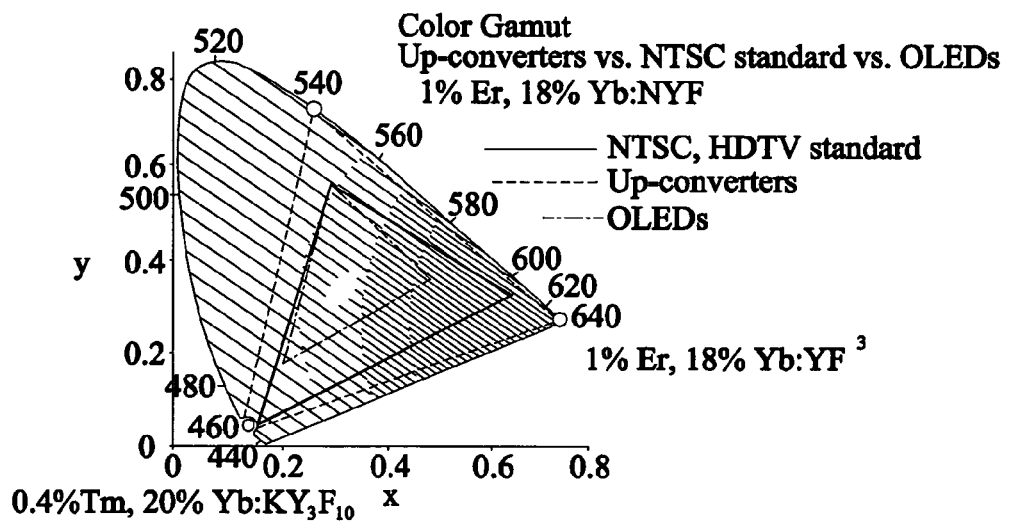
FIG. 12 shows differences between the color garnet of up-converters according to the present invention (dashed line), NTSB standards (solid line) and organic light emitting diodes (dot-dash line).

FIG. 4 shows the detailed spectral emissions from the red, green, and blue up-converters. These spectral overlaps, along with the color gamut chart comparing the NTSC standard, OLEDs, and up-converters of the present invention, are shown in FIG. 12. Like nitride LEDs, OLEDs don't yet reach the NTSC color gamut. The resulting color gamut that can be achieved with the up-converters is shown FIG. 12 along with the NTSC/HDTV standard, and that of competing OLED technology. The up-converters can reach approximately 125% of the NTSC/HDTV standard. The wide color gamut of the up-converters is useful not only for high resolution HMDs, but also for the low voltage backlight sources for LCD and LCoS displays. For the up-converters without spectral separation, however, there is considerable spectral overlap between the green and red colors, and a small overlap between the blue and red.

Figure 13:
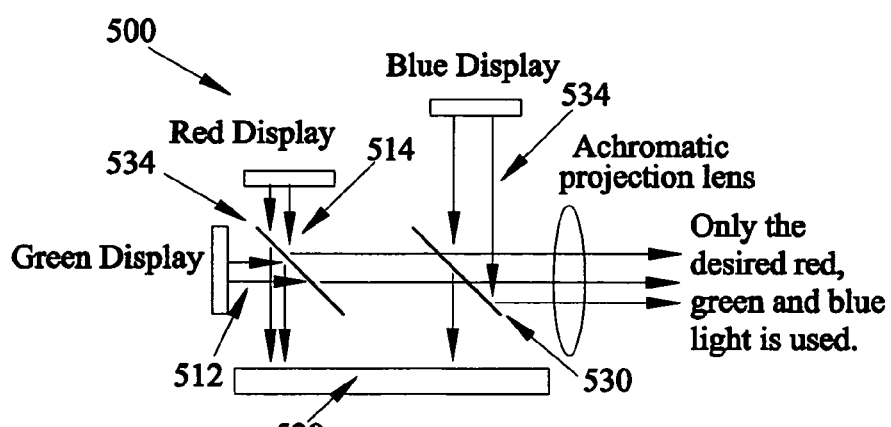
FIG. 13 is a schematic diagram of an optical system for eliminating the small spectral overlap between the different colors in a color multiplexed projection system.

FIG. 13 shows an optical system 500 for eliminating the small spectral overlap between the different colors in a color multiplexed projection system. Wavelength selective beam splitters are used to eliminate the red emission from the green and blue pixilated display chips, and the green emission from the red pixilated display chip. The RGB multiplexing system shown in FIG. 13 is described in co-pending U.S. Provisional Patent Application No. 61/026,827 filed on Feb. 7, 2008.

The projection optical system 500 uses two spectrally selective beam splitters 510 and 530 for beam combining of the separate red, green, and blue pixilated chip colors. The first beam splitter 510 transmits the green emission 512 while reflecting the red emission 514. Its placement as shown then rejects the red emission at approximately 660 nm from the green chip into a waste light absorber 520, while combining the green pixilated emission 512 with the red emission 514 from the red pixilated chip. The green emission from the red pixilated chip is transmitted into the waste light absorber 520. Thus, high spectral purity green and red pixel information is produced traveling to the right in FIG. 13. A similar technique is used at the second beam splitter 530 for the blue pixilated chip, which now reflects blue pixilated emission to combine with the green and red color information, while transmitting the unwanted red emission from the blue chip into the waste light absorber 520.

The projection system 500 shown in FIG. 13 is suitable for compact packaging into a sophisticated high resolution head mounted displays for medical applications, gaming and entertainment, and training and simulation, or even in a larger scale with higher power chips for laptop or larger projection systems. It can also be incorporated into lower cost RGB head mounted displays based on fewer pixel counts for augmented reality.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A monolithic up-converting resonant cavity light emitting diode RGB pixel device comprising:
   an array of resonant cavity light emitting diodes producing an output light;
   an array of up-converters coupled with the array of resonant cavity light emitting diodes, wherein the output light from the array of resonant cavity light emitting diodes induces optical excitation in the array of up-converters, each up-converter comprising:

an optical cavity coupled with one of the array of resonant cavity light emitting diodes; and an up-converting material deposited on the optical cavity, wherein cavity tuning is accomplished by a thickness of the up-converting material; and a power source for applying an electrical energy to the array of resonant cavity light emitting diodes for generating an output to excite the up-converting material to convert near-infrared light from the resonant cavity light emitting diodes to a light in a visible range.

2. The device of claim 1, wherein each optical cavity has a cavity quality factor in a range between approximately 100 to approximately 200 for efficient excitation by the resonant cavity light emitting diodes.

3. The device of claim 1, wherein the array of up-converters comprises:

a red up-converter;

a green up-converter; and a blue up-converter, wherein the red, green and blue up-converters have a common absorption band to enable exciting each of the red, green and blue up-converters with the resonant cavity light emitting diode array.

4. The device of claim 3, wherein each of the resonant cavity light emitting diode is an approximately 975 nm resonant cavity light emitting diode.

5. The device of claim 4, wherein the power source comprises:

electrodes for applying the electrical energy to each resonant cavity light emitting diode in the array; and control lines for applying a control signal to the array of resonant cavity light emitting diodes for active matrix addressing.

6. The device of claim 5, further comprising:

an optical system coupled with the monolithic up-converting resonant cavity light emitting diode RGB pixel for use as a color multiplexed projection system.

7. The device of claim 6, wherein the optical system comprises:

a wavelength selective beam splitter to eliminate a spectral overlap between produced red, green and blue light beams in a color multiplexed projection system.

8. The device of claim 5, further comprising:

a micro display device having plural sets of the monolithic up-converting resonant cavity light emitting diode RGB pixels for displaying an image to a user.

9. The device of claim 5, further comprising:

a red display device, a green display device and a blue display device for producing a red image, and green image and a blue image, respectively;

a wavelength selective beam splitter for filtering the red, green and blue images to eliminate spectral overlap between the produced red, green and blue images and to combine the reflected red, green and blue images in a color multiplexed projection system; and an absorber for absorbing the eliminated spectral overlap beams transmitted through the wavelength selective beam splitter to the absorber.

10. The device of claim 1, wherein each of the resonant cavity light emitting diodes is an approximately 975 nm resonant cavity light emitting diode based on an InGaAs quantum well and a AlAs/GaAs mirror.

11. The device of claim 1, wherein the resonant cavity light emitting diodes having an output in a range of approximately 970 nm to approximately 980 nm.

12. The device of claim 1, further comprising:

a back mirror behind the array of resonant cavity light emitting diodes to increase an emission efficiency of the array of up-converters.

* * * * *